United States Patent [19]
Kahlert et al.

[11] Patent Number: 5,336,855
[45] Date of Patent: Aug. 9, 1994

[54] MULTILAYER PRINTED CIRCUIT BOARD, IN PARTICULAR, FOR HIGH-FREQUENCY OPERATION

[75] Inventors: Joachim Kahlert; Klaus P. May; Joachim Noll, all of Aachen, Fed. Rep. of Germany

[73] Assignee: U.S. Philips Corporation, New York, N.Y.

[21] Appl. No.: 817,238

[22] Filed: Jan. 6, 1992

[30] Foreign Application Priority Data

Jan. 7, 1991 [DE] Fed. Rep. of Germany ....... 4100238

[51] Int. Cl.⁵ .............................................. H05K 1/00
[52] U.S. Cl. .................................... 174/250; 174/262; 174/264; 361/784
[58] Field of Search .............. 174/250, 251, 255, 260, 174/262, 264, 266; 361/412, 414, 784

[56] References Cited

U.S. PATENT DOCUMENTS

| | | | |
|---|---|---|---|
| 4,641,425 | 2/1987 | Dubuisson | 174/262 X |
| 4,803,595 | 11/1987 | Kraus et al. | 361/412 |
| 4,811,082 | 3/1989 | Jacobs et al. | 174/262 X |
| 5,012,047 | 4/1991 | Dohya | 174/250 |
| 5,072,075 | 12/1991 | Lee et al. | 174/264 |

Primary Examiner—Leo P. Picard
Assistant Examiner—Cheryl R. Figlin
Attorney, Agent, or Firm—David Schreiber

[57] ABSTRACT

The invention relates to a multilayer printed circuit board, in particular, for high-frequency operation, having least an outer, plane dielectric layer for accommodating interconnection paths of equal cross-section and component as well as further alternately provided metallic and dielectric layers for forming a reference earth and for the voltage supply to said interconnection paths and components via plated-through holes. In order to obtain a plane surface for the interconnection paths and predetermined areas on the printed circuit board, which areas have different characteristic impedances when interconnection paths having the same cross-section are used, at least the first metal layer comprises at least one window and the subsequent metal layer has a metal island corresponding to the area of the window, which island is connected to the reference earth via a buried plated-through hole, and the characteristic impedance of the interconnection paths is a function of the resulting thickness of the effective dielectric layers the number of which is increased in the area of the window.

10 Claims, 2 Drawing Sheets

MULTILAYER PRINTED CIRCUIT BOARD, IN PARTICULAR, FOR HIGH-FREQUENCY OPERATION

BACKGROUND OF THE INVENTION

The invention relates to a multilayer printed circuit board, in particular, for high-frequency operation, comprising at least a first, outer, plane dielectric layer for accommodating interconnection paths of equal cross-section and components as well as further alternately provided metallic and dielectric layers for forming a reference earth and for the voltage supply to said interconnection paths and components via plated-through holes.

The interconnection method used to form complex circuits employs printed circuits constructed according to multilayer technology, which circuits are referred to as multilayer printed circuit boards. In the case of steep signal edges of, for example, digital signals which are to be transferred from one integrated circuit to another integrated circuit, the influence of the interconnection paths has to be taken into account when the propagation time in the interconnection path corresponds approximately to the rise time of the circuit. This causes serious pulse distortions, reflections and more or less damped oscillations.

These errors can be precluded by using interconnection paths having a defined characteristic impedance. Such interconnection paths are termed microstrip lines which can be obtained by manufacturing all interconnection paths on one side of a dielectric plate or layer on which, if necessary, components are mounted, and applying a continuous metal layer to the opposite side of the dielectric plate, which side is subsequently connected to earth. As a result thereof, all interconnection paths become microstrip lines.

For this reason, in high-frequency solutions special cross-sectional geometries of the interconnection paths and printed circuit boards are used to obtain specific characteristic impedances or interconnection-path impedances. In the case of, for example, a rectangular cross-section of an interconnection path, the characteristic impedance is determined by its width and height as well as by the thickness and permittivity of the printed circuit board, i.e. ultimately by the dielectric constant of the dielectric printed circuit board. When the interconnection paths have a round cross-section. apart from the permittivity, the diameter of the cross-section only plays a part when the thickness of the dielectric plate considerably exceeds the diameter or the height of the interconnection paths. This is known from, for example, the textbooks "Integrierte Mikrowellenschaltungen -Elektrische Grundlagen . . . , R. K. Hoffmann, Springerverlag Berlin Heidelberg New York Tokyo 1983, page 142 ff." and "Impulse auf Leitungen, W. Hillberg, Oldenburg Verlag München Wien, page 121 ff.".

A problem which occurs frequently in high-frequency circuits is that a large part of said circuits is constructed for a specific characteristic impedance, whereas some parts of the circuit require a different, often higher, characteristic impedance, or that, analogous to the compensation of power dividers in high-frequency engineering, branches must be adapted in a broad band and with low reflection.

When interconnection paths having a rectangular cross-section are used, most step changes in characteristic impedance can be realised by adapting the cross-sectional width while the cross-sectional height remains the same. The customarily used etching techniques do not present any difficulties.

The adaptation of the characteristic impedances does present difficulties, however, when interconnection paths having equal, for example, round cross-sections are used. Such multilayer printed circuit boards in which for the manufacture of interconnection paths discrete wires are provided by very accurate wiring machines are known from multiwire- and microwire-techniques as described in, for example, "High Density Discrete Wiring Offers A Solution To Chip Carrier Design, C.L. Lassen, M. M. Motazedi, ELECTRONIC PACKAGING AND PRODUCTION. January, 1983", "A Discrete-Wired Solution for High Speed Surface - Mount Packaging, T. J. Buck, ELECTRONIC PACKAGING AND PRODUCTION, June 1985" and in the product-information document "MICROWIRE TM - Interconnection Technology, PCK Technology Division 322 South Surface Road, Melville, N.Y. 11747". As in such wiring techniques the wire diameter is fixedly determined, changes in characteristic impedance can, in principle, only be obtained by changing the thickness of the dielectric plates because in conventional manufacturing methods the permittivity can generally not be varied.

According to a known method, the thickness of the dielectric plate is changed by subjecting the relevant area to a milling operation. However, this leads to an unevenly structured surface, which considerably complicates, in particular, the provision of the interconnection paths in an automatic process and leads to higher characteristic impedance values instead of lower values in the area in question.

Other known methods of adapting the characteristic impedance lie in the field of circuit technology. They do not actually influence the characteristic impedance of an interconnection path but compensate undesired errors by a suitable circuit design. For example, reflections always occur in reproducible connections to a high-speed bus. The bus can be terminated at its end portion in a reflection-free manner, but all other coupling points will cause undesirable reflections. This problem can be minimized by providing the bus line with a termination having the lowest possible impedance, as the coupling points cause the effective impedance to decrease. This, however, leads to drive problems and, for this reason, the bus is driven at a predetermined impedance and all coupling points are coupled at a high-impedance. Reflections at the end portion of the bus must be accepted and, since their position is known. have to be taken into consideration by suitably designing the circuit layout. Thus, measures in the field of the design of the circuit are suitable under certain conditions only.

SUMMARY OF THE INVENTION

It is an object of the invention to provide a multilayer printed circuit board, in particular, for high-frequency operation, comprising a plane surface for interconnection paths and predetermined are, as on said surface, which areas accommodate interconnection paths having a uniform cross-section but different characteristic impedances.

According to the invention, this object is achieved in that at least the first metal layer comprises at least one window and the subsequent metal layer has a metal island corresponding to the area of the window, which island is connected to the reference earth via a buried plated-through hole, and the characteristic impedance of the interconnection paths is a function of the resulting thickness of the effective dielectric layers the number of which is increased in the area of the window.

In accordance with the invention, the change of the characteristic impedances at a specific cross-section of the interconnection paths and the printed circuit board can be realised by structuring the voltage supply and earth at the same plane, which can be attained by removing the metal layers separating the dielectric layers in the desired area and isolating a metal island in a metal layer, which island is connected to the reference earth and produces the microstrip line desired in said area.

When the interconnection paths are provided in a mechanical process, said interconnection paths advantageously have a uniform, round cross-section.

The shape of the window areas in the metal layers and the islands which are parallel and congruent therewith can be adapted in accordance with the constructional requirements of the printed circuit board, i.e. in accordance with the arrangement of the interconnection paths on the printed circuit board. This has the additional advantage that it is also possible to use a printed circuit board construction which is designed for a multilayer printed circuit board having an equal characteristic impedance for all interconnection paths. In this case, the measures relating to circuit design and intended to preclude errors can be omitted. In the manufacture of the multilayer printed circuit board according to the invention, advantageously, the window areas are etched out of the corresponding metal layers, as is a narrow edge which forms and bounds the relevant islands.

Plated-through holes, also termed vias, which are known per se can lead from the interconnection paths through at least the first and the second dielectric layer and the first metal layer to at least one of a number of voltage-supplying metal layers.

Advantageously, the first metal layer forms the reference earth of the interconnection paths. The electric potential of said layer may be applied to flat contact areas at the islands via buried plated-through holes.

In common with known prior-art multilayer printed circuit boards, advantageously, the multilayer printed circuit board according to the invention can suitably be provided with components on both sides. Such a printed circuit board may be constructed of two separate circuit board layers joined at a voltage-supplying metal layer."

Advantageously, all the dielectric layers have the same thickness and all the metal layers have the same thickness to obtain maximum correspondence with known multilayer printed circuit boards and, hence, improve their interchangeability.

In accordance with a particular embodiment of the invention, all the metal layers may have the same thickness, whereas the dielectric layers have different thicknesses, to enable a more accurate and finer adaptation to a desired characteristic impedance.

In a further advantageous embodiment of a multilayer printed circuit board which can be provided with components on both sides, the dielectric layers may have different thicknesses on either side.

Further advantageous embodiments of the invention are described in the sub-claims.

BRIEF DESCRIPTION OF THE DRAWINGS

The invention will be described in greater detail by means of an exemplary. embodiment and with reference to the accompanying drawings, in which.

DETAILED DESCRIPTION OF THE PREFERRED EMBODIMENTS

Figure 1:
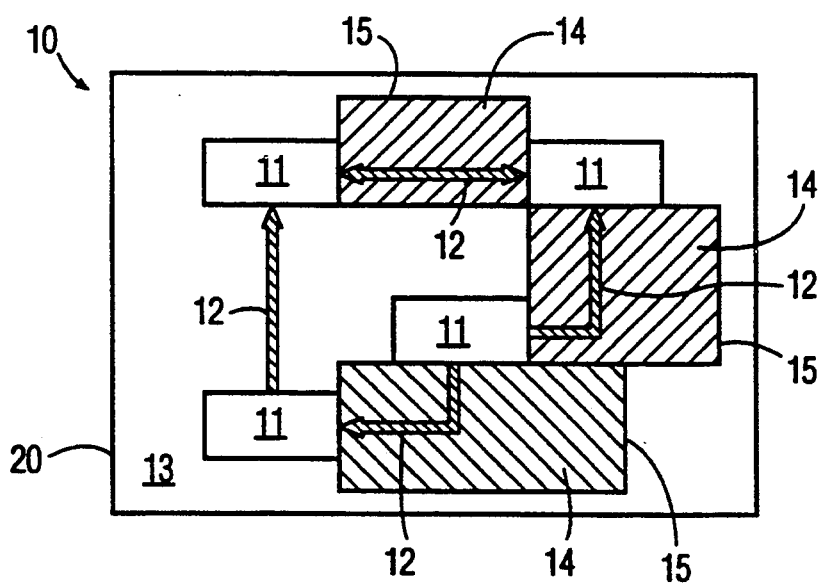
FIG. 1 is a plan view of a multilayer printed circuit board according to the invention.

FIG. 1 is a plan view of a multilayer printed circuit board 10 according to the invention, comprising different components 11 which are diagrammatically represented. Said components 11 are interconnected through the diagrammatically represented interconnection paths 12. Since the components 11 are generally different, different characteristic impedances, mostly graduated line impedances, are required in the interconnection paths 12. In an area 13, which is not hatched in FIG. 1, the multilayer printed circuit board 10 can generate a characteristic impedance of, for example, 75 Ohm in corresponding interconnection paths 12. In window areas 14 of windows 15, which are right-hatched in the upper and middle parts of FIG. 1, a characteristic impedance of, for example, 100 Ohm can be generated in the interconnection paths 12. In the hatched lower window area 14 of window 15, shown in FIG. 1, a characteristic impedance of for example 125 Ohm can be generated in the interconnection paths 12. It is to be noted that the graduation of said values only serves to illustrate that starting from a basically low characteristic impedance further windows 15 having window areas 14 with higher characteristic impedances may be provided on the same printed circuit board 10.

Figure 2:
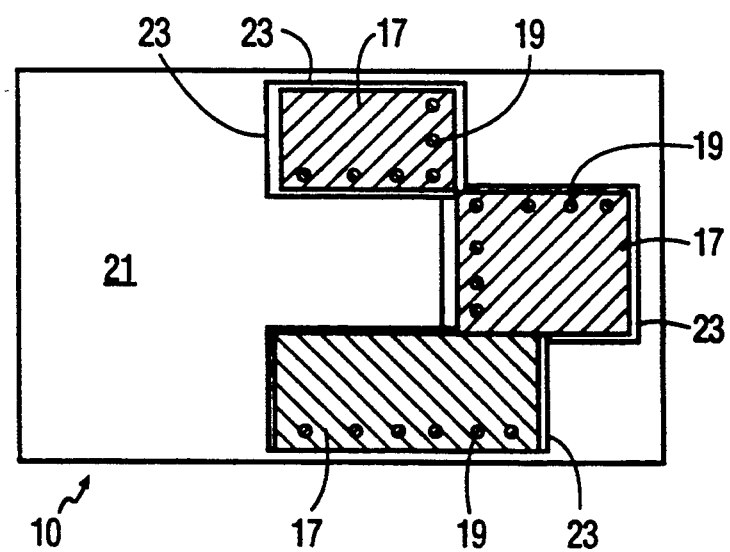
FIG. 2 is a partly cut-away plan view of a printed circuit board according to FIG. 1, showing each of the metal layers or islands forming the characteristic impedances.

FIG. 2 is also a plan view of a multilayer printed circuit board 10 according to the invention, in which parts are left out so that a first metal layer 21 is shown in the area 13 in accordance with FIG. 1, and islands 17 are shown in the upper and middle window areas 14 in accordance with FIG. 1 as well as an island 17 in the lower window region 14 in accordance with Fig. 1. In FIG. 2, buried plated-through holes 19 are diagrammatically shown in the islands 17, said plated-through holes serving to connect the islands 17 to, for example, the first metal layer 21. An edge 23 is, partly visibly, provided around the islands 17, which serves to electrically insulate the islands 17 from the corresponding metal layer 21.

Figure 3:
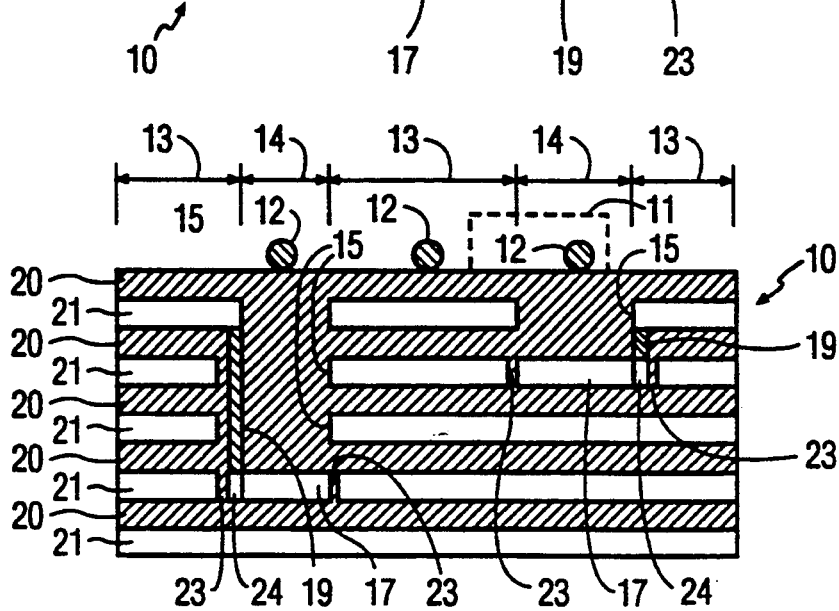
FIG. 3 is a sectional side view of a multilayer printed circuit board according to the invention.

FIG. 3 is a side view of a multilayer printed circuit board 10 according to the invention. It is to be noted, that the arrangement of the window areas 14 does not correspond to the arrangement shown in Figs. 1 and 2. The multilayer printed circuit board 10 comprises a first, plane, dielectric outer layer 20 which is shown in the upper part of FIG. 3 and which serves to accommodate interconnection paths 12 and components 11 which are indicated above layer 20 by circular cross-sectional elements and broken lines, respectively. The interconnection paths 12 have a circular, uniform cross-section and, thus, can readily be provided in an automated process. Electronic components 11 are also arranged above layer 20. Underneath layer 20 there is provided an abutting, first metal layer 21 followed by an abutting further dielectric layer 20. The multilayer printed circuit board 10 comprises further dielectric and metal layers 20 and 21 which are alternately provided.

In this connection, the first metal layer 21 serves as a reference earth and is connected to islands 17 through buried plated-through holes 19. The components 11 which are arranged above the dielectric layer 20 and which are represented by broken lines in FIG. 3 are connected themselves or via the interconnection path 12 to one of the voltage-supplying metal layers 21 following the first metal layer 21, through plated-through holes which are not shown. The first metal layer 21 comprises windows 15 having window areas 14. Underneath the window area 14 of the first layer 21, as shown on the right in FIG. 3, the following metal layer 21 exhibits an island 17 which is isolated from said metal layer 21 by an edge 23. Underneath the window area 14 of the first metal layer 21, as shown on the left in FIG. 3, two successive metal layers 21 also exhibit windows 15 and the following layer 21 exhibits an island 17 which is also isolated from said metal layer 21 through an edge 23. As is clearly illustrated in FIG. 3, the left window area 14 exhibits, for example, four dielectric layers up to the island 17, and the right window area 14 exhibits two layers up to the island 17. Area 13, however, exhibits only one dielectric layer 20 up to the corresponding first metal layer 21 forming the reference earth. This enables different dielectric layer thicknesses, and hence different characteristic impedances in uniform interconnection paths 12, to be readily provided in predetermined areas, for example 13 and 14, of a multilayer printed circuit board 10.

Advantageously, the windows of the window areas 14 and the congruent islands 17 extending parallel thereto can be adapted to the constructional requirements of the printed circuit board.

The window areas 14 are sections which are removed from the metal layers 21 by etching. The narrow, etched-out, edge 23 which forms and bounds the island 17 is provided between a metal layer 21 and the island 17 in question.

Plated-through holes, not shown, extend from the interconnection paths 12, and possibly from the components 11, through at least the first and the second dielectric layers 20 and the first metal layer 21 to at least one of a number of voltage-supplying metal layers 21.

The first metal layer 21 forms the reference earth for the interconnection paths 12. The electric potential of the reference earth is applied to the islands 17 via buried plated-through holes 19. For this purpose, the islands 17 whose surface area normally corresponds to that of the window areas 14 may exhibit contact areas 24, for example projections extending in the same plane, as shown in FIG. 3.

Figure 4:
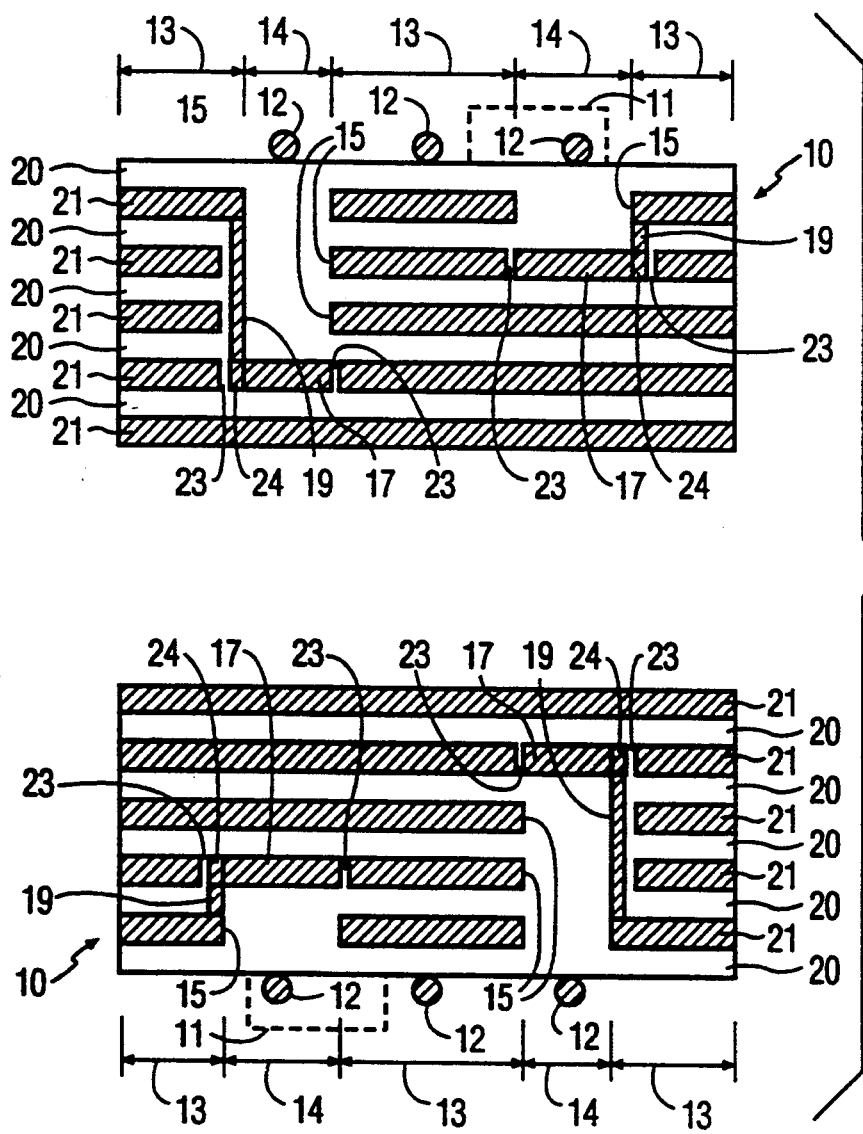
FIG. 4 is a sectional side view of a multilayer printed circuit board having components on both sides.

In FIG. 3, the metal layers 21 arranged below the first metal layer 21 are used for voltage supply and may serve as, in the case of a double sided board, as the voltage-supplying layer for the components mounted on both sides of the board. Such a double sided board 100 is shown in FIG. 4. Two circuit boards 10 are joined at a voltage-supplying metal layer 21 so that components 11 can be mounted on both sides of double sided board 100.

As shown in FIG. 3, all dielectric layers 20 may have the same thickness and all metal layers 21 may have the same thickness. It is noted, that the metal layers 21 are applied, for example, by vacuum evaporation, so that they are very thin. In order to obtain a more accurately and more finely tuned assembly, all the metal layers 21 may have the same thickness whereas the dielectric layers 20 have mutually differing thicknesses. Further, in the case of a double-sided mounting of components, the dielectric layers 20 may have a different thickness on either side.

As in the case of equal thicknesses of the dielectric layers 20 the characteristic impedances can only be varied stepwise and the step size depends on said thicknesses, it is advantageous for a more finely adjustable and higher characteristic impedance to build up the metal layers 21 themselves as quasi-multilayers, i.e. to separate them by thin dielectric layers whose individual thicknesses must be known exactly because of the required calculation of the printed circuit board 10. By suitably etching windows 15 in a number of such metal layers 21 and bringing a terminating island 17 into contact with the reference earth, the characteristic impedance can be finely varied in accordance with the number of metal layers, which is very advantageous as the formation of a specific circuit does not require a re-dimensioning of the known printed circuit board construction.

The characteristic features of the invention as described in this document, in FIGS. 1, 2 and 3 and in claims 1 to 10, can be of essential importance, both individually and in any combination, for the realisation of the various embodiments of the invention.

What is claimed is:

1. A multilayer printed circuit board comprising:
   an uppermost dielectric layer for accommodating a plurality of interconnection paths and components, the interconnection paths having equal cross-section;
   a first metallic layer having a window;
   a further dielectric layer positioned below the first metallic layer;
   a second metallic layer positioned below the further dielectric layer for supplying a supply voltage to the interconnection paths and the components;
   a second dielectric layer positioned below the second metallic layer;
   a lower metallic layer positioned below the second dielectric layer having an island corresponding to an area of the window; and
   each of the interconnection paths having a predetermined impedance controlled by a thickness of the dielectric layers between the interconnection path and the island.

2. The circuit board of claim 1, wherein the interconnection paths have a circular cross-section.

3. The circuit board of claim 2, wherein an area of the window and an area of the island are equal.

4. The circuit board of claim 3, wherein the island is insulated from the lower metallic layer.

5. The circuit board of claim 4, wherein the interconnection paths are insulated from the first metallic layer, the uppermost dielectric layer and the further dielectric layer and coupled to the further metallic layer by way of plated through holes.

6. The circuit board of claim 5, wherein the first metallic layer is coupled to the island at a contact area by way of plated through holes.

7. A multilayer printed circuit board comprising:

an uppermost dielectric layer for accommodating a plurality of upper interconnection paths and upper components, the upper interconnection paths having equal cross-section;

a lowermost dielectric layer for accommodating a plurality of lower interconnection paths and lower components, the lower interconnection paths having equal cross-section;

a first upper metallic layer forming a reference earth;

a further upper dielectric layer positioned below the first upper metallic layer;

a first lower metallic layer forming a reference earth;

a further lower dielectric layer positioned below the first lower metallic layer;

a second upper metallic layer positioned below the further upper dielectric layer for supplying a supply voltage to the interconnection paths and the components, the second upper metallic layer including an upper window;

a second lower metallic layer positioned above the further lower dielectric layer for supplying a supply voltage to the lower interconnection paths and the lower components, the second lower metallic layer including a lower window;

a further upper dielectric layer positioned below the second upper metallic layer;

a further upper metallic layer positioned below the further upper dielectric layer having an upper island corresponding to an area of the upper window, the upper island connected to the reference earth;

a further lower dielectric layer positioned above the second lower metallic layer;

a further lower metallic layer positioned above the further lower dielectric layer having a lower island corresponding to an area of the lower window, the lower island connected to the reference earth; and each of the upper and lower interconnection paths having a predetermined impedance controlled by a thickness of the dielectric layers between the interconnection path and one of the upper and lower island.

8. The circuit board of claim 1, wherein the uppermost dielectric layer, the further dielectric layer and the second dielectric layer have equal thickness.

9. The circuit board of claim 8, wherein the first metallic layer and, the further metallic layer and the lower metallic layer have equal thickness.

10. The circuit board of claim 1, wherein the first metallic layer and, the further metallic layer and the lower metallic layer have equal thickness.

* * * * *